(12) United States Patent
deVilliers

(10) Patent No.: US 9,824,894 B2
(45) Date of Patent: Nov. 21, 2017

(54) METHOD FOR CORRECTING WAFER BOW FROM OVERLAY

(71) Applicant: Tokyo Electron Limited, Minato-ku, Tokyo (JP)

(72) Inventor: Anton J. deVilliers, Clifton Park, NY (US)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 14/682,242

(22) Filed: Apr. 9, 2015

(65) Prior Publication Data

US 2015/0294917 A1 Oct. 15, 2015

Related U.S. Application Data

(60) Provisional application No. 61/977,282, filed on Apr. 9, 2014.

(51) Int. Cl.
| | | |
|---|---|---|
| *H01L 21/265* | (2006.01) | |
| *H01L 21/66* | (2006.01) | |
| *H01L 21/30* | (2006.01) | |
| *H01L 21/302* | (2006.01) | |

(52) U.S. Cl.
CPC ........ *H01L 21/2658* (2013.01); *H01L 21/265* (2013.01); *H01L 21/302* (2013.01); *H01L 22/20* (2013.01); *H01L 22/12* (2013.01)

(58) Field of Classification Search
CPC ............... H01L 21/2658; H01L 21/265; H01L 21/3065; H01L 21/31; H01L 22/20; H01L 21/302; G01B 5/28; G01N 21/9501
USPC ................................. 438/7; 257/415; 702/35
See application file for complete search history.

(56) References Cited

U.S. PATENT DOCUMENTS

| | | | |
|---|---|---|---|
| 5,374,564 A | 12/1994 | Bruel | |
| 5,851,929 A * | 12/1998 | Thakur | ............. H01L 21/67288 438/795 |
| 2002/0045352 A1* | 4/2002 | Kubota | ................ G11B 5/3163 438/706 |

(Continued)

FOREIGN PATENT DOCUMENTS

| | | | |
|---|---|---|---|
| JP | 2014-154608 | 8/2014 | |
| KR | 10-2011-0044046 | 4/2011 | |
| WO | WO 2013145348 A1 * | 10/2013 | ....... H01L 21/67288 |

OTHER PUBLICATIONS

International Patent Application No. PCT/US2015/025087, "International Search Report and Written Opinion," dated Jun. 30, 2015, International Application Filing Date Apr. 9, 2015.

*Primary Examiner* — Moazzam Hossain
*Assistant Examiner* — Omar Mojaddedi
(74) *Attorney, Agent, or Firm* — DLA Piper LLP US

(57) ABSTRACT

Described herein are methods for flattening a substrate, such as a semiconductor wafer, to reduce bowing in such substrates. Methods include treating or bombarding a backside surface of a substrate with particles of varying doses, densities, and spatial locations. Particle bombardment and selection is such that the substrate becomes more planar by selectively increasing or decreasing z-height points to reduce overall deflection. One or more tensile or compressive films can be added to the backside surface to be selectively relaxed at specific point locations. Such methods can correct bowing in substrates resulting from various fabrication processes such as thermal annealing.

19 Claims, 4 Drawing Sheets

(56) References Cited

U.S. PATENT DOCUMENTS

| | | | |
|---|---|---|---|
| 2002/0158702 A1 | 10/2002 | Tikka et al. | |
| 2006/0051938 A1 | 3/2006 | Connell et al. | |
| 2009/0309191 A1* | 12/2009 | Theuss | H01L 21/0201 257/618 |
| 2012/0252222 A1* | 10/2012 | Gumpher | H01L 21/26506 438/758 |
| 2013/0038862 A1* | 2/2013 | Hamamatsu | G01N 21/956 356/51 |
| 2014/0287538 A1* | 9/2014 | Inoue | H01L 21/67288 438/4 |
| 2015/0044783 A1* | 2/2015 | Carswell | H01L 21/30625 438/5 |

* cited by examiner

METHOD FOR CORRECTING WAFER BOW FROM OVERLAY

CROSS REFERENCE TO RELATED APPLICATIONS

The present application claims the benefit of U.S. Provisional Patent Application No. 61/977,282, filed on Apr. 9, 2014, entitled "Method for Correcting Wafer Bow from Overlay," which is incorporated herein by reference in its entirety.

BACKGROUND OF THE INVENTION

This disclosure relates to semiconductor fabrication, and particularly to wafer overlay.

Semiconductor fabrication involves multiple varied steps and processes. One typical process is known as photolithography (also called microlithography). Photolithography uses radiation, such as ultraviolet or visible light, to generate fine patterns in a semiconductor device design. Many types of semiconductor devices, such as diodes, transistors, and integrated circuits, can be fabricated using semiconductor fabrication techniques including photolithography, etching, film deposition, surface cleaning, metallization, and so forth. Exposure systems (also called tools) are used to implement photolithographic techniques. An exposure system typically includes an illumination system, a reticle (also called a mask) or spatial light modulator (SLM) for creating a circuit pattern, a projection system, and a wafer alignment stage for aligning a photosensitive resist-covered semiconductor wafer. The illumination system illuminates a region of the reticle or SLM with a preferably rectangular slot illumination field. The projection system projects an image of the illuminated region of the reticle pattern onto the wafer. For accurate projection, it is important to expose a pattern of light on a wafer that is relatively flat or planar, preferably having less than 10 nanometers of height deviation.

SUMMARY

As semiconductor device fabrication technology advances, there are increasing demands on photolithography systems and coaters/developers used to manufacture the semiconductor devices. This includes increasing demands on the accuracy of substrate alignment. A substrate is typically mounted on a chuck, also referred to as a wafer table. During exposure, the features being exposed on the substrate need to overlay existing features on the substrate. To achieve desired overlay performance, the substrate is aligned to the substrate stage prior to exposure. Any movement of the substrate relative to the substrate stage after alignment, however, can result in overlay errors.

Various fabrication process steps can cause expansion and/or contraction of the substrate, resulting is a warped or bowed substrate. For example, during exposure a substrate is heated locally due to the energy transferred to the substrate from an exposure beam. Substrates are also heated during anneal processes. This heating causes the substrate to expand. If the substrate expansion is unchecked, the expansion exceeds overlay error requirements. Moreover, if the clamping force between the substrate and the substrate chuck is not sufficient to prevent substrate expansion, then the substrate can slip on the substrate chuck and larger substrate expansion will occur, resulting in larger overlay errors. Slipping can be more pronounced in some processes, such as in extreme ultraviolet ("EUV") systems, because the environment surrounding the substrate during exposure is a vacuum. Thus, vacuum clamping is not always possible, and the weaker electrostatic clamping must be used in lieu of a vacuum clamp.

Other fabrication steps can also cause substrate expansion and contraction. For example, deposited films can cause substrate contraction. Also, various annealing and doping steps can create substantial amounts of bow in a given substrate. Annealing steps can especially create overlay challenges. The result of these various fabrication steps is a substrate that is uneven or non-planar. For example, a backside of the substrate can have z-height differences (differences in vertical heights) that have both high spots and low spots. Such height differences due to such bowing can be on the order of about a micron to approximately 100 microns. This fluctuation is significant because semiconductor devices or structures being exposed by various exposure tools are being exposed on scales of tens of nanometers to hundreds of nanometers. Thus having deflection variations of thousands of nanometers to 10,000 nanometers can dramatically reduce yield.

Conventional techniques used to address substrate bow and uneven curvature on partially-processed substrates focus on chucking techniques to chuck (or clamp or suck) a substrate to a substrate holder to flatten curvature. With such significant bowing, however, it can be very difficult or impossible to accurately flatten a substrate by chucking a substrate alone. Thus, it is desirable to have a substrate bow correction technique to correct substrate bow and improve overly prior to being sent or returned to a scanner for additional exposures.

Techniques disclosed herein include methods for flattening a substrate, which flattening can improve overlay. In an example method, a substrate is received for processing. This substrate has multiple semiconductor structures that are at least partially fabricated on a top surface of the substrate. The substrate has a backside surface that is non-planar. The backside surface being non-planar as a result of fabrication of the multiple semiconductor structures. The backside surface is opposite the top surface. Deflection areas are identified on the backside surface of the substrate. Particles are directed to strike the backside surface of the substrate based on identified deflection areas on the backside surface of the substrate, thereby causing the backside surface to become planar, which enables subsequent microfabrication steps to be successful.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present invention can be embodied and viewed in many different ways.

Note that this summary section does not specify every embodiment and/or incrementally novel aspect of the present disclosure or claimed invention. Instead, this summary only provides a preliminary discussion of different embodiments and corresponding points of novelty over conventional techniques. For additional details and/or possible perspectives of the invention and embodiments, the reader is directed to the Detailed Description section and corresponding figures of the present disclosure as further discussed below.

BRIEF DESCRIPTION OF THE DRAWINGS

A more complete appreciation of various embodiments of the invention and many of the attendant advantages thereof will become readily apparent with reference to the following detailed description considered in conjunction with the accompanying drawings. The drawings are not necessarily to scale, with emphasis instead being placed upon illustrating the features, principles and concepts.

DETAILED DESCRIPTION

Techniques include treating a backside or backside surface of a substrate with particles of varying doses, densities, and spatial locations such that stress controlled by inside energies due to the substrate interaction changes the substrate bow to improve overlay. In other words, techniques herein included targeted particle bombardment of a substrate backside surface to flatten a substrate or cause the substrate to become more planar by reducing points of deflection. The top side of a substrate (opposite that of backside) typically receives a film stack, fabricated devices, partially fabricated devices, features, etc. Thus, the top side of the substrate can also be known as a working surface. In semiconductor fabrication, substrates typically become warped or bowed due to the overlay of various films and devices being deposited and/or fabricated thereon. Such processes can include annealing and other treatments that tend to warp a substrate. Techniques herein, however, correct such warping and bowing of substrates.

Figure 1A:
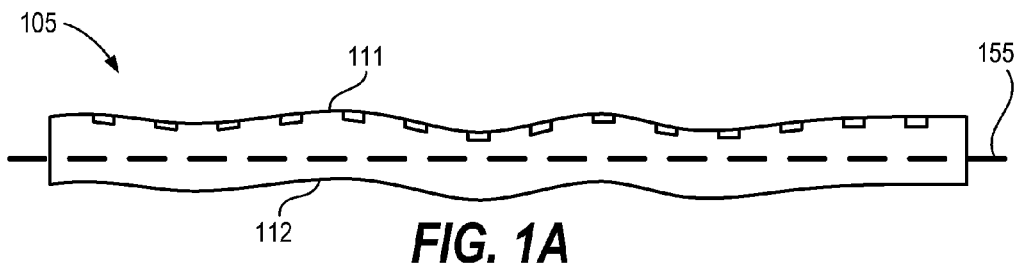
FIGS. 1A and 1B are schematic illustrations of an example substrate with bowing.
Figure 1B:
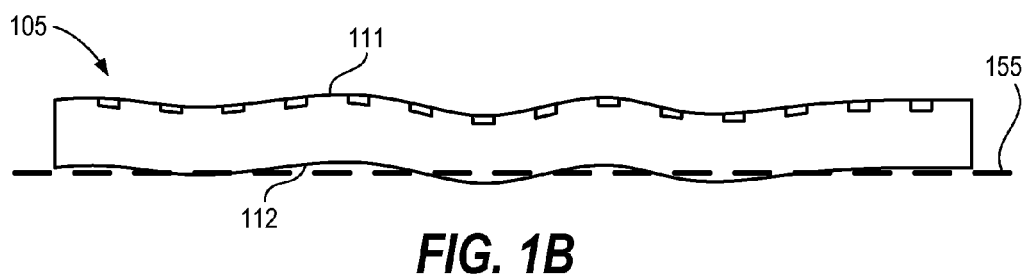

One embodiment herein includes a method for flattening a substrate. The method comprises receiving a substrate, or providing a substrate or otherwise accessing a substrate to be flattened. FIG. 1A illustrates an example substrate 105. Reference planar line 155 is not part of substrate 105, but merely illustrates a planar or flat reference point. Substrate 105 has multiple semiconductor structures that are at least partially fabricated on a top surface 111 of the substrate 105. For example, such structures can include gates, transistors, trenches, vias, hard masks, films, etc. Thus, substrate 105 can be a semiconductor-grade substrate. The substrate has a backside surface 112 that is non-planar. The backside surface 112 is non-planar as a result of fabrication of the multiple semiconductor structures. The backside surface 112 is opposite the top surface 111 (also known as a working surface). In FIG. 1B, reference planar line 155 is moved to the backside surface 112 to help illustrate bowing of the substrate 105. Note that the entire substrate can have bowing (including top surface 111) and that this bowing is at least manifest in the backside surface 112. Also note that initially, the substrate 105 can be planar in that surface height deviations can remain within a tolerance of about 10 nanometers or even 100 nanometers. Also note that being non-planar herein is relative to micron distances or micron scaling. For example, surface height deviations of greater than about 5 microns to approximately 300 microns can be considered non-planar. Thus, from inspection by eye the substrate may appear perfectly flat, but relative to the resolution capability of photolithography systems, such a bowed substrate can make accurate exposure difficult or impossible.

Conventionally, a given substrate can develop a bow or deflection of between 5 and 100 microns. Normally such an uneven substrate would not be successfully exposed on a photolithography tool because of difficulty focusing, among other challenges. Conventionally, accurate exposure is only possible by sucking a warped substrate down on a substrate chuck with sufficient force to hold the substrate flat enough to be accurately exposed. Such chucking to compensate for an uneven substrate, however, is not desirable because such pulling (from the chuck) can create internal stresses that move substrate features and films around. This creates overlay distortion which can destroy patterning processes, especially with emerging 3D integration techniques. For example, as films become thicker on the front end of substrate processing, this introduces more stresses on the substrate which can create more bowing such that an overlay signature becomes very difficult to fix. Conventionally, a chucking mechanism inside a photolithography scanner tries to chuck or hold a substrate flat to within about 10 nanometers of being a planar substrate. This chucking process, however, twists the internal stress of a substrate and can move the overlay signature out of alignment.

After receiving a substrate having surface deflections, deflection areas on the backside surface of the substrate are identified. Such deflection measurement can be accomplished using various mechanisms, such as optical detection, reflective techniques, and acoustic measurements. This measurement can be used to create a deflection signature of the substrate, which maps deflection areas on the backside surface. This measurement essentially measures substrate bow. By way of a non-limiting embodiment, this can include creating x,y or radial locations of a given substrate that include a z-height measurement or relative deflection tied to a planar coordinate system. This can be a positive or negative value to distinguish between convex and concave portions, though other scaling systems can be used. Thus, the deflection signature maps relative differences in height by lateral location (spatial location) on the substrate.

Once deflection is measured and a deflection signature is identified or calculated, areas can be identified that need either convex or concave adjustment. The substrate can then be raster scanned, with intensity modulation, using an ion beam across the backside of a substrate to create concave or convex adjustments that rectify deflection on the substrate. This can include directing particles to strike the backside surface of the substrate based on identified deflection areas on the backside surface of the substrate. In other words, the deflection signature is used to fix bowing on a substrate by particle bombardment/implantation that corrects a curvature of a given substrate.

Figure 5:
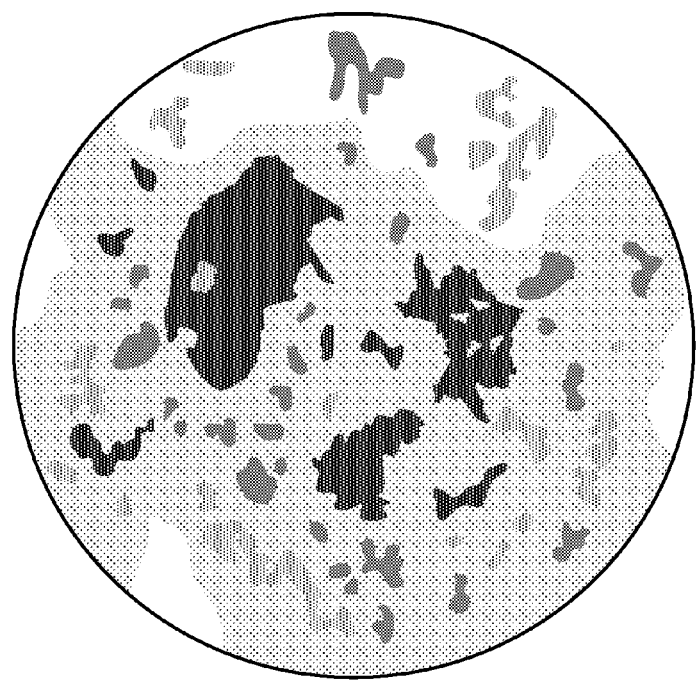
FIG. 5 is an illustration representing an example deflection signature as described herein.

FIG. 5 is an illustration representing an example deflection signature. In this example deflection signature, different types of deflection (convex or concave) and amounts of deflection of a given circular substrate can be shown by the various degrees of lightness and darkness. This representation can be useful to visualize how different types of deflections can be distributed across a given substrate. In practice, any given deflection signature can be stored only in computer memory and can be stored similar to raster image files or other files that identify a color or magnitude and type by grid location (x-y location). With such a deflection signature identified, a particle bombardment pattern can be generated, which can be, for example, the inverse of the deflection signature or simply aligned with the deflection signature.

Creating adjustments that are concave versus convex depends on a type of particle or ion being directed to strike the backside surface. This can depend on type of particle, ion, and landing energy. Type of particle, type of ion and landing energy can be selected to cause a displacement of lattice structure or to cause lattice compaction of a given lattice structure. During ion bombardment, location-based targeting can be accomplished either by moving an ion beam director, moving an ion beam system, or a substrate can move relative to the ion beam. Correction can happen either with one full pass of a substrate, or multiple passes can be used. For example, based on a given deflection signature or deflection map, the greatest magnitude deflections can be roughly corrected first, and then this can be followed by a second pass or subsequent passes to realize fine tuning corrections. Thus there can be multiple passes of particle bombardment if it is desired to incrementally correct deflection. Such incremental correction can be beneficial when relatively large corrections are needed. In other embodiments, a single pass can be executed for correction.

Figure 2A:
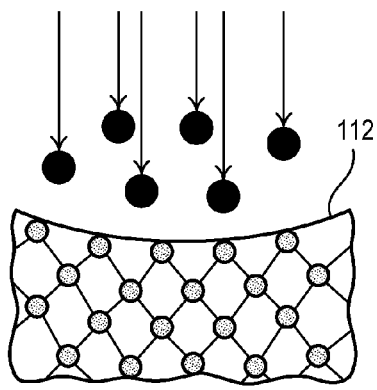
FIG. 2A is a schematic illustration of a substrate segment being processed according to embodiments disclosed herein.
Figure 2B:
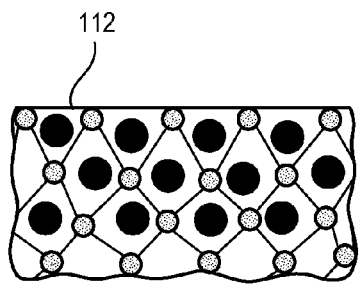
FIG. 2B is a schematic illustration of a substrate segment processed according to embodiments disclosed herein.

In one embodiment, directing particles includes varying particle parameters based on type of deflection being corrected. Directing particles can also include directing lattice-expansion causing particles at areas on the backside surface identified as having a concavity, and directing lattice-contraction causing particles at areas on the backside surface identified as having a convexity. There are different ways that an implant will affect or interact with a particular material. Implants can either break down a lattice with lattice compaction, or create interstitial sites that expand a lattice. FIGS. 2A, 2B, 3A, and 3B illustrate this. Note that these views show only a segment of the substrate 105 with the backside surface facing the top of the sheet. In one example correction, FIG. 2A shows a cross-sectional segment of a substrate with backside surface 112 having a concavity or inward deflection in this segment. To correct this concavity, particular ions are implanted into the substrate at this location so that internal compressive stresses are created, which causes the lattice structure to swell or increase. A resultant lattice structure is shown in FIG. 2B which now has a planar surface as compared to FIG. 2A. The resultant amount of swelling depends on type of particle, amount of particles and energy used, number of particles being implanted, and so forth.

Figure 3A:
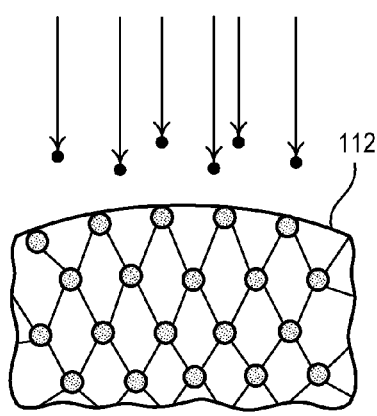
FIG. 3A is a schematic illustration of a substrate segment being processed according to embodiments disclosed herein.
Figure 3B:
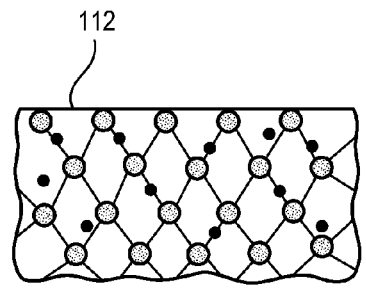
FIG. 3B is a schematic illustration of a substrate segment processed according to embodiments disclosed herein.
Figure 4A:
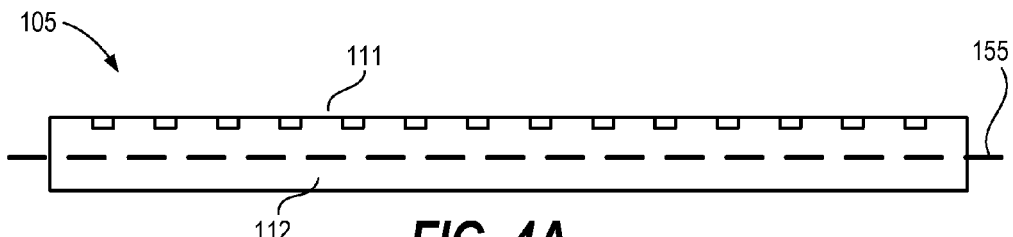
FIGS. 4A and 4B are schematic illustrations of an example substrate having bowing corrected according to embodiments disclosed herein.
Figure 4B:
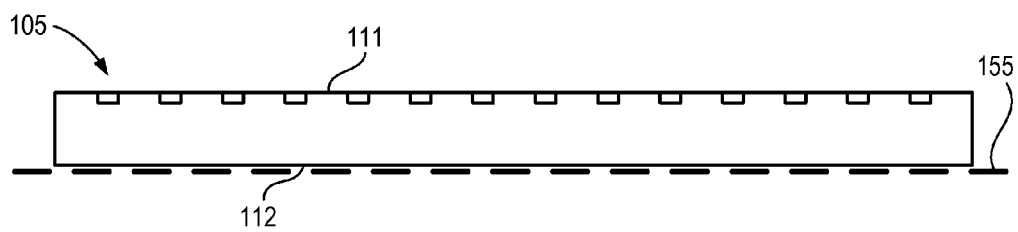

Alternatively, ion bombardment can be used to cause lattice compaction that collapses substrate surfaces inward, thereby making a smaller structure. FIG. 3A illustrates a cross-sectional segment of substrate 105 showing a convex portion of backside surface 112. Particles are also being directed toward this convex portion. These particles break some of the lattice structure in the substrate material causing a collapse or contraction of the backside surface. A resulting planar surface is shown in FIG. 3B. FIGS. 4A and 4B are schematic illustrations of how substrate 105 from FIGS. 1A and 1B can appear after particle treatment for flattening the substrate.

Achieving a given expansion or contraction of film/substrate curvature can depend on a mechanism of a given implant and properties of a corresponding, treated lattice structure. The result can include either creating or introducing a compressive stress, or creating or introducing a tensile stress in a given film or substrate material. An ion beam can be used to scan and treat for the relative intensities and species across the back of a substrate, and then any uneven surface signature can be corrected. For example, a given substrate may initially begin as a relatively warped or uneven substrate and then be corrected to a flat state. Note that such warping is relative to semiconductor scales. For example, any warping may not be visible to the human eye in that a warped substrate appears flat, but such warping can be on a scale of tens of microns to hundreds of microns, with a desire to correct such warping to within hundreds or tens of nanometers or less. With semiconductor structures being fabricated in the tens of nanometers and less, such a warping distance on micron scales can be very difficult to overcome to complete an entire fabrication process accurately.

Figure 6:
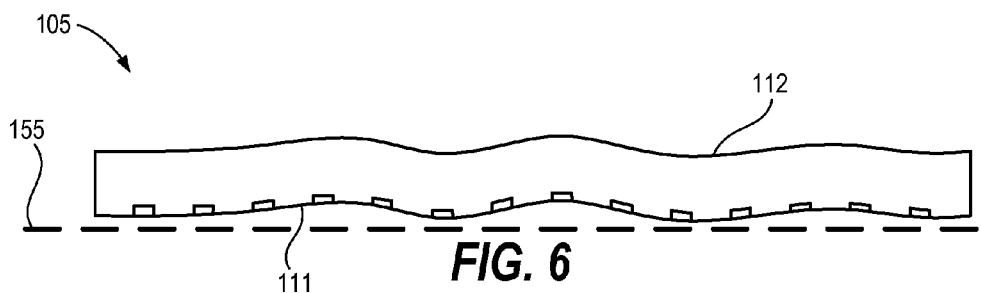
FIG. 6 is a schematic illustration of a substrate segment to be processed according to embodiments disclosed herein.
Figure 7:
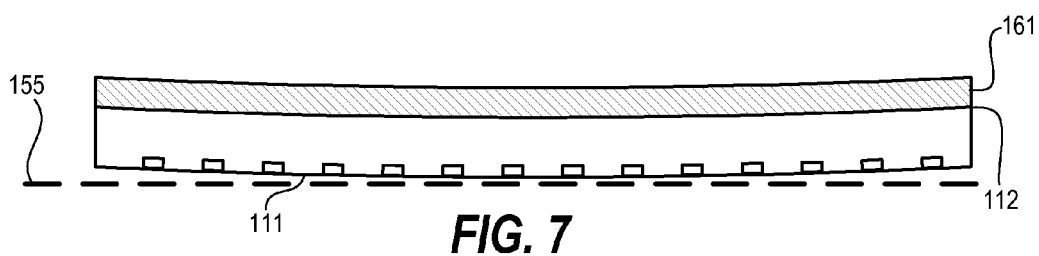
FIG. 7 is a schematic illustration of a substrate segment being processed according to embodiments disclosed herein.
Figure 8:
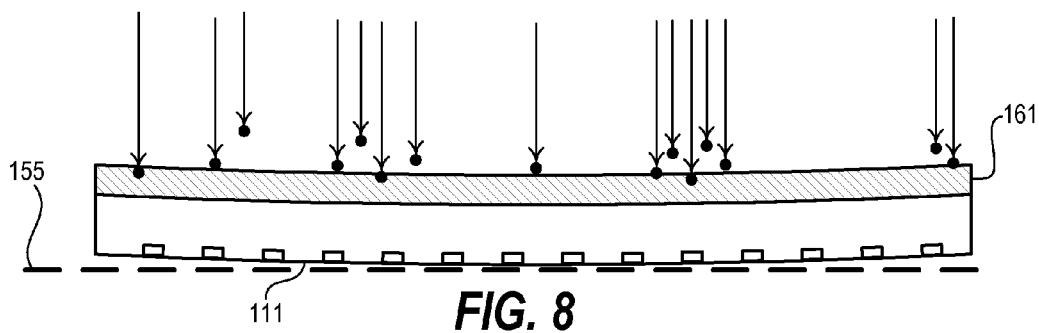
FIG. 8 is a schematic illustration of a substrate segment receiving particle bombardment according to embodiments disclosed herein.
Figure 9:
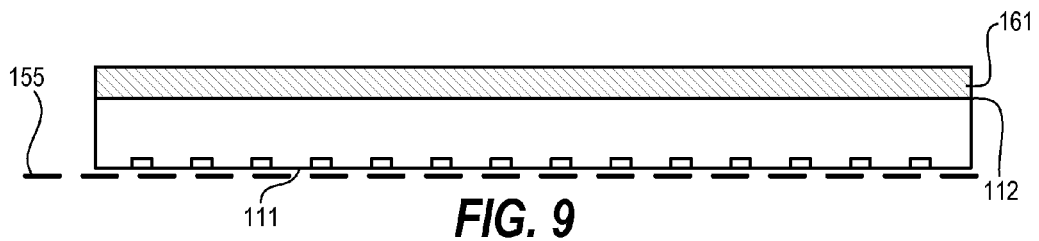
FIG. 9 is a schematic illustration of an example substrate having bowing corrected according to embodiments disclosed herein.

Other embodiments can include depositing one or more films on the backside surface to assist with bow correction. FIG. 6 shows substrate 105 with backside surface 112 toward a top of the page, and having visible bowing. A first layer 161 is deposited on the backside surface 112 of substrate 105 prior to directing particles to strike the backside surface. The first layer 161 can have a tensile or compressive stress. Directing particles to strike the backside surface of the substrate then includes directing particles to strike the first layer 161 at specific locations causing a lessening of a tensile stress or lessening of a compressive stress at the specific locations. In other words, a film can be deposited on the backside surface 112 that either pulls a substrate inwardly, or pushes outwardly. For a tensile stress film, the result can bend the substrate as if it were a bowl. FIG. 7 shows substrate 105 with first layer 161 that cause curvature across the substrate. FIG. 8 shows particles striking first layer 161 at various locations to relax stresses in first layer 161. The locations and amount of particle bombardment can be based on a deflection signature, which can be a signature before depositing first layer 161, or after depositing first layer 161. FIG. 9 then shows an example result after relaxing (or increasing) stresses in first layer 161.

Alternatively, the first layer 161 can be deposited as having a neutral stress. Directing particles to strike the backside surface of the substrate includes directing particles to strike the first layer at specific locations causing an increase or decrease in concavity at the specific locations. Various films and materials can be selected for first layer 161 to increase or decrease concavity from a specific particle bombardment.

Figure 10:
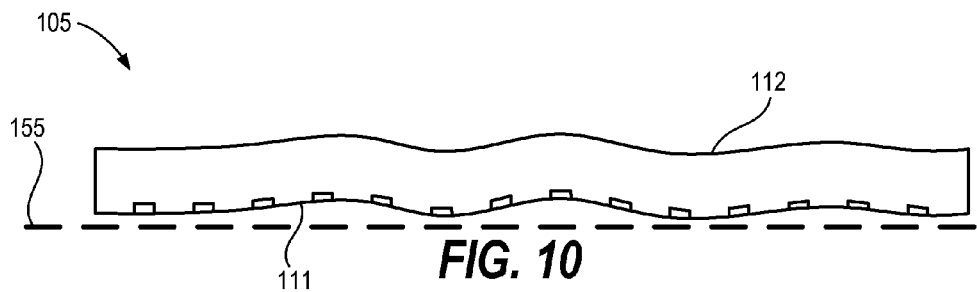
FIG. 10 is a schematic illustration of a substrate segment to be processed according to embodiments disclosed herein.
Figure 11:
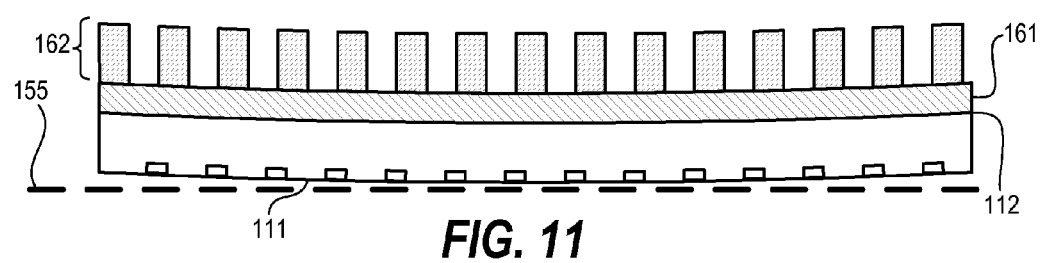
FIG. 11 is a schematic illustration of a substrate segment being processed according to embodiments disclosed herein.

Other embodiments can include two or more layers to assist with bowing correction. FIG. 10 shows substrate 105 with backside surface 112 toward a top of the page, and having visible bowing. A first layer 161 is deposited on the backside surface 112 prior to directing particles to strike the backside surface. The first layer 161 can have a tensile stress. A second layer 162 is deposited on the first layer 161 prior to directing particles to strike the backside surface 112. The second layer 162 can have a compressive stress. Note that compressive and tensile stresses can be reversed for the two or more layers. FIG. 11 shows an example result of backside surface 112 having two layers deposited thereon. In some embodiments, the second layer 162 can defines a relief pattern such that portions of the first layer are uncovered to allow for selective adjustments.

Figure 12:
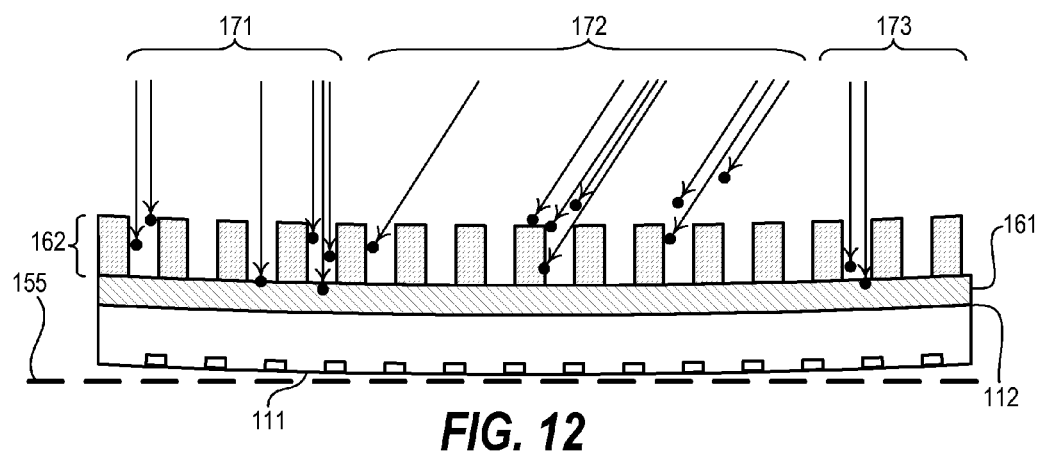
FIG. 12 is a schematic illustration of a substrate segment receiving particle bombardment according to embodiments disclosed herein.
Figure 13:
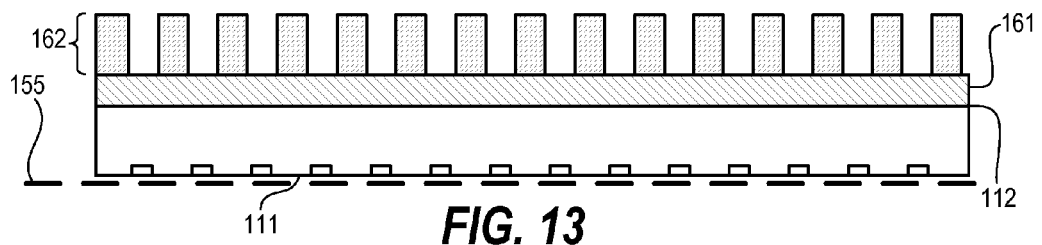
FIG. 13 is a schematic illustration of an example substrate having bowing corrected according to embodiments disclosed herein.

Directing particles to strike the backside surface of the substrate can include directing particles to selectively strike the first layer 161 at first specific locations to cause an increase in concavity (or convexity) at the first specific locations, and directing particles to strike the backside surface of the substrate can include directing particles to selectively strike the second layer 162 at second specific locations to cause a decrease in concavity (or convexity) at the second specific locations. Directing particles to selectively strike the first layer 161 at first specific locations can include directing particles towards the backside surface at angle normal to the backside surface. For example, in FIG. 12, particles strike the substrate at a normal angle of incidence in regions 171, and 173. Directing particles to selectively strike the second layer 162 at second specific locations can include directing particles towards the backside surface at an angle oblique to the backside surface such that particles primarily strike the second layer 162. For example, in FIG. 12, particles strike the substrate at an oblique angle of incidence in region 172. In other embodiments, directing particles to strike the backside surface of the substrate can include selectively controlling an amount of particle bombardment between the first layer 161 and the second layer 162 by controlling an angle of incidence of particles directed toward the backside surface in that the angle of incidence selectively controls an amount of induced concavity. The second layer 162 can provides a stress on the backside surface of the substrate in a direction of features within the relief pattern, such as a stress in the direction of lines on the substrate. FIG. 13 then shows an example result after relaxing and/or increasing stresses in first layer 161 and second layer 162.

Thus, in some embodiments, two or more layers or films can interact with each other to improve bowing correction. Layers can interact with each other at different energy levels. Some layers deposited can be textured to mitigate wafer slip or chucking effect. One layer can define a pattern (relief pattern) and can be a mask for the other layer. Structures or lines in the defined pattern can then shadow the underlying layer from particles that enter at an angle, as shown in FIG. 12. By implanting particles in the raised structures, these structures can swell without causing swelling or compaction of the underlying layer. With such a relief pattern or layer combination on the backside surface, Both concave and convex adjustments can be made at the same time or using a same particle beam by changing the angle of incidence of the particle beam. For example, normal incidence particles striking a lower surface of one material can cause contraction of that material, while angled bombardment to strike sidewalls of structures of protruding material can result in swelling. Thus, convex and concave adjustments can be made simultaneously and/or with a same type of particle beam.

Note that materials and films for correcting substrate bow can be all sacrificial and also are not needed to be electrically active, which provides flexibility in material selection. Films and materials that are not organic can be beneficial backside surface layers. Films and materials can also be selected for etch or etch-resistant properties. The substrate surface can be held on the edge of a wafer if desired to help avoid damage to any electrical devices on a working surface of the substrate.

Regarding layer selection, various types of materials can be selected based on a type of substrate being corrected, an amount of bowing, layer interactions, etc. By way of a non-limiting example, a nitride layer of 100-300 nanometers can be deposited, which can provide a relatively strong tensile stress and can tend to pull a substrate into a bowl shape. A particle beam can then be directed at specific x-y locations on the backside surface which causes these bombardment locations to relax and go flat.

In another example, by using two or more masks, simultaneous concave and convex adjustments can be made. One of the layers provides a relief pattern of structures oriented in a given direction or directions. These patterned spots then provide an x-y component for changing concavity in any direction. For example, to cause a positive concavity change, a normal incident bombardment is executed that strikes open surfaces of a lower film (such as a nitride). Then for a negative concavity change, an oblique angled beam can be directed at a particular region of the substrate. With the oblique angled particle beam, the lower film (for example, nitride) will be shadowed from bombardment, while the protruding structures (for example, oxide fins) absorb particles and experience a swelling effect. Oxide fins can be created on the order of about 2-5 microns in height, or otherwise have a high aspect ratio. Such a high aspect ratio can be beneficial in shadowing underlying layers such that a smaller angle off normal for particle bombardment can be used with the underlying layer shadowed. In other words, with two or more films on the backside surface, a concave or convex adjustment can be made by manipulating a particle bombardment angle by region on the backside surface of the substrate. With techniques herein, substrates of any warped shape can be adjusted and corrected.

Note that any conventional or emerging technologies can be used for patterning backside surface films including photolithographic, direct write, bubble jet print, directed self-assembly, roll-stamped, projected, screen printed, etc. Note that such backside surface patterns can be created on scales larger than that of particular electrical devices (such as transistors or capacitors) being fabricated. By way of a non-limiting example, features of hundreds of nanometers or tens of microns can be effective for correcting wafer bow of conventional wafers.

Other methods for flattening a substrate can include receiving a substrate having multiple semiconductor structures that are at least partially fabricated on a top surface of the substrate. The substrate being initially planar prior to fabrication of semiconductor structures. The substrate having a backside surface that is non-planar as a result of fabrication of the multiple semiconductor structures. The backside surface is opposite the top surface. Areas of convexity and concavity are identified on the backside surface of the substrate that defines an overlay signature. A first layer is deposited on the backside surface prior to directing particles to strike the backside surface, the first layer having a tensile stress. A second layer is deposited on the first layer prior to directing particles to strike the backside surface. The second layer has a compressive stress and defines a relief pattern such that portions of the first layer are uncovered. Particles are directed to strike the backside surface of the substrate based on the overlay signature on the backside surface of the substrate, the particles causing either surface expansion or surface contraction such that the backside surface becomes planar. An amount of particle bombardment between the first layer and the second layer is selectively controlled by controlling an angle of incidence of particles directed toward the backside surface, such that the angle of incidence selectively controls an amount of induced concavity or convexity.

Another embodiment for flattening a substrate includes receiving a substrate having a backside surface that is non-planar. The backside surface is opposite the top surface, which is a working surface on which structures are formed. Deflection areas are identified on the backside surface of the substrate and particles are implanted in the backside surface of the substrate (or one or more deposited films) based on identified deflection areas on the backside surface of the substrate such that deflection areas are reduced in an amount of deflection.

Embodiments can include directing particles via a plasma-based system or via a gas cluster ion beam system. Particles can include ions, molecules, atoms, atom clusters, molecule clusters, etc. Varying particle parameters can include selecting particle size and energy, bombardment duration, amount of particles, and so forth. For example, such variation can include selecting a particle size and energy for a given spatial location (x,y location) on the backside surface based on the deflection signature.

Ion implantation and ion beam systems are known and have been used for years as system to dope silicon with various materials to yield beneficial properties such as improved carrier mobility. A typical ion implantation apparatus comprises an ion source, such as a plasma chamber configured to produce plasma, and an acceleration mechanism that accelerates and/or directs particles towards a target, such as a substrate. Note that ions can be neutralized during travel such that either charged particles or neutral particles strike a target surface. Particles can be directed as groups of particles, such as with using a gas cluster ion beam (GCIB) system. Ion implantation systems can be configured for blanket projection (such as with plasma flux) or targeted projection (such as an ion beam).

Thus, implantation or bombardment can be used to increase or decrease concavity or convexity. Correction could be used multiple times during fabrication of a given substrate. For example, after a few masking and/or etching steps, a given substrate may develop a given deflection signature, which can be fixed with techniques herein. Subsequent fabrication steps (continued etching, application of films, etc.) can relax the signature and result in a non-planar substrate once again. Thus, multiple distinct flattening operations can be executed on a given substrate between various fabrication processes. In one embodiment, backside surface bombardment is executed (or is repeated) until areas of convexity and concavity are reduced such that z-height variations in the back side surface are less than about 20 nanometers.

One beneficial fabrication result of using techniques herein to fix substrate bowing is to fix bowing after depositing metal on contact as part of transition to back-end-of-line processing. During this transition processing, there can be implant anneal steps that tend to create a lot of bowing. At this point, an accurate overlay is critical to have a back-end that lines up with the front end. Thus, correcting a deflection signature after this anneal or at this transition point can be very beneficial. This technique can also be beneficial between applications of subsequent metal layers. This can depend on a grade of the device. For example, with high-grade devices, the deflection correction step can be used for patterning each metal layer. In lower-grade devices, however, deflection correction does not need to be executed between every metal layer application. Thus, techniques herein can dramatically improve yield. In other words, techniques herein can fix bowing and thereby impact overlay non-uniformities. In other words, techniques herein provide a method for overlay correction. While a notable benefit of producing a planar substrate from a bowed substrate is to improve accuracy for subsequent exposure operations, other processing benefits are realized, such as improved substrate handling.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the invention. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the invention. Such variations are intended to be covered by the scope of this disclosure. As such, the foregoing descriptions of embodiments of the invention are not intended to be limiting. Rather, any limitations to embodiments of the invention are presented in the following claims.

The invention claimed is:

1. A method for flattening a substrate, the method comprising:

receiving a substrate, the substrate having multiple semiconductor structures that are at least partially fabricated on a top surface of the substrate, the substrate having a backside surface that is non-planar, the backside surface being non-planar as a result of fabrication of the multiple semiconductor structures, the backside surface being opposite the top surface;

identifying at least first and second deflection areas on the backside surface of the substrate; and directing matter particles to strike the backside surface of the substrate according to a first bombardment characteristic at the first deflection area and a second bombardment characteristic different from the first bombardment characteristic at the second deflection area on the backside surface of the substrate.

2. The method of claim 1, wherein identifying the at least first and second deflection areas includes creating a deflection signature of the substrate, the deflection signature identifying the at least first and second deflection areas on the backside surface.

3. The method of claim 2, wherein the deflection signature maps relative differences in height by lateral location on the substrate.

4. The method of claim 2, wherein directing matter particles includes varying an amount of matter particles directed at a given spatial location of the backside surface based on the deflection signature.

5. The method of claim 1, wherein identifying the at least first and second deflection areas includes measuring substrate bow.

6. The method of claim 1, wherein directing matter particles includes varying matter particle parameters based on type of deflection being corrected.

7. The method of claim 6, wherein directing matter particles includes:

directing lattice-expansion causing matter particles at areas on the backside surface identified as having a concavity; and directing lattice-contraction causing matter particles at areas on the backside surface identified as having a convexity.

8. The method of claim 1, wherein directing matter particles includes directing matter particles via a gas cluster ion beam.

9. The method of claim 1, wherein directing matter particles includes directing matter particles selected from the group consisting of ions, molecules, atoms, atom clusters, and molecule clusters.

10. The method of claim 1, wherein directing matter particles includes executing ion bombardment of the backside surface.

11. The method of claim 1, wherein directing matter particles includes directing matter particles using a gas cluster ion beam system.

12. The method of claim 1, wherein the substrate includes at least one patterned layer having been patterned by photolithography and etched into an underlying layer.

13. The method of claim 1, wherein the substrate is a silicon wafer.

14. The method of claim 13, wherein the silicon wafer is a semiconductor grade wafer.

15. The method of claim 6, wherein varying matter particle parameters includes selecting particle size and energy.

16. The method of claim 15, wherein selecting matter particle size and energy for a given spatial location on the backside surface is based on a deflection signature.

17. A method for flattening a substrate, the method comprising:

receiving a substrate, the substrate having multiple semiconductor structures that are at least partially fabricated on a top surface of the substrate, the substrate being initially planar prior to fabrication of the multiple semiconductor structures, the substrate having a backside surface that is non-planar, the backside surface being non-planar as a result of fabrication of the multiple semiconductor structures, the backside surface being opposite the top surface;

identifying at least first and second areas of convexity or concavity on the backside surface of the substrate that defines an overlay signature; and directing matter particles to strike the backside surface of the substrate according to a first bombardment characteristic at the first area of convexity or concavity a second bombardment characteristic different from the first bombardment characteristic at the second area of convexity or concavity on the backside surface of the substrate based on the overlay signature on the backside surface of the substrate, the matter particles causing either surface expansion or surface contraction such that the backside surface becomes planar.

18. The method of claim 17, wherein the backside surface becoming planar includes reducing areas of convexity or concavity such that z-height variations in the back side surface are less than about 20 nanometers.

19. A method for flattening a substrate, the method comprising:

receiving a substrate, the substrate having a backside surface that is non-planar, the backside surface being opposite the top surface, the top surface being a working surface on which structures are formed;

identifying at least first and second deflection areas on the backside surface of the substrate; and implanting matter particles in the backside surface of the substrate according to a first implant characteristic at the first deflection area and a second implant characteristic different from the first implant characteristic at the second deflection area on the backside surface of the substrate such that deflection areas are reduced in an amount of deflection.

* * * * *